(12) United States Patent
Kim et al.

(10) Patent No.: US 10,701,821 B2
(45) Date of Patent: Jun. 30, 2020

(54) DISPLAY DEVICE WITH ROLLABLE DISPLAY PANEL

(71) Applicant: LG Display Co., Ltd., Seoul (KR)

(72) Inventors: Jeonghun Kim, Goyang-si (KR); Bongchul Kim, Gyeongsangbuk-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/046,766

(22) Filed: Jul. 26, 2018

(65) Prior Publication Data
US 2019/0037716 A1     Jan. 31, 2019

(30) Foreign Application Priority Data

Jul. 31, 2017    (KR) .................. 10-2017-0096876

(51) Int. Cl.
| | |
|---|---|
| *H05K 5/02* | (2006.01) |
| *H05K 5/00* | (2006.01) |
| *G06F 1/16* | (2006.01) |
| *F03G 1/02* | (2006.01) |
| *H01L 51/52* | (2006.01) |
| *H01L 27/32* | (2006.01) |

(52) U.S. Cl.
CPC ......... *H05K 5/0217* (2013.01); *G06F 1/1652* (2013.01); *H05K 5/0017* (2013.01); *F03G 1/02* (2013.01); *H01L 27/3213* (2013.01); *H01L 51/5237* (2013.01); *H01L 2251/5338* (2013.01)

(58) Field of Classification Search
CPC ...... H05K 5/0217; H05K 5/0017; F03G 1/02; H01L 27/3213; H01L 51/5237; H01L 2251/5338; G06F 1/1652

USPC .......................................................... 361/752
See application file for complete search history.

(56) References Cited

U.S. PATENT DOCUMENTS

| | | | | |
|---|---|---|---|---|
| 7,559,163 | B2 * | 7/2009 | Ofuji .................. | G03B 21/58 160/265 |
| 2013/0312920 | A1 * | 11/2013 | Mullet ................ | E06B 9/40 160/310 |
| 2014/0362512 | A1 | 12/2014 | Hinson | |
| 2015/0153777 | A1 * | 6/2015 | Liu .................... | G06F 1/1652 345/173 |
| 2016/0112667 | A1 * | 4/2016 | Park .................. | G06F 1/1601 348/739 |

(Continued)

FOREIGN PATENT DOCUMENTS

| | | |
|---|---|---|
| CN | 105741683 A | 7/2016 |
| CN | 10625179 A | 12/2016 |

(Continued)

*Primary Examiner* — Rockshanda D Chowdhury
(74) *Attorney, Agent, or Firm* — Seed IP Law Group LLP

(57) ABSTRACT

The display device includes a rollable display panel configured to display an image; a display-panel roller, the display panel being fixed thereto, the roller being elongate; a support frame, the display-panel roller being rotatably coupled to the frame; a drive motor configured for rotating the display-panel roller with respect to the support frame, wherein a rotation of the display-panel roller allows roll-up of the panel around the roller or unroll-down of the panel from the roller; and an elastic unit configured to configured to provide an elastic force to assist in rolling up the display panel around the display-panel roller. This allows reduction of a size or capacity of the motor.

19 Claims, 12 Drawing Sheets

(56) References Cited

U.S. PATENT DOCUMENTS

| | | | | |
|---|---|---|---|---|
| 2016/0187929 A1* | 6/2016 | Kim | .................... | G06F 1/1652 |
| | | | | 345/184 |
| 2016/0320804 A1* | 11/2016 | Takayanagi | ........... | G06F 1/1615 |
| 2016/0324021 A1* | 11/2016 | Takayanagi | ........... | G06F 1/1652 |
| 2017/0161868 A1 | 6/2017 | Kim et al. | | |
| 2017/0325343 A1* | 11/2017 | Seo | .................... | G06F 1/1652 |

FOREIGN PATENT DOCUMENTS

| CN | 106816093 A | 6/2017 |
|---|---|---|
| JP | 58-199990 A | 11/1983 |
| JP | 59-150894 U | 10/1984 |
| JP | 2004-163568 A | 6/2004 |
| JP | 2006-113504 A | 4/2006 |
| JP | 2011-49411 A | 3/2011 |
| JP | 2014-10597 A | 1/2014 |
| KR | 10-2016-0129668 A | 11/2016 |

\* cited by examiner (a)

(b)

<Unroll Down>

<Roll Up>

DISPLAY DEVICE WITH ROLLABLE DISPLAY PANEL

CROSS-REFERENCE TO RELATED APPLICATIONS

This application claims the priority of Korean Patent Application No. 10-2017-0096876 filed on Jul. 31, 2017, in the Korean Intellectual Property Office, the disclosure of which is hereby incorporated by reference in its entirety.

BACKGROUND

Technical Field

The present disclosure relates to a display device with a rollable display panel.

Description of the Related Art

As the information technology has developed gradually, a market of display devices as communication means used to transmit information to users is increasing. In this connection, display devices such as an organic light emitting display (OLED), a liquid crystal display (LCD), and a plasma display panel (PDP) are increasingly employed.

The organic light emitting display (OLED) includes a display panel including a plurality of sub-pixels, and a driver for driving the display panel. The driver includes a scan driver configured to supply a scan signal or a gate signal to the display panel, and a data driver configured to supply a data signal to the display panel.

The organic light emitting display (OLED) may have flexibility. Thus, the display panel thereof may be bent or curved. Further, the display panel may be rolled in a roll shape and then extend in a flat shape. In recent years, a variety of structures have been designed to accommodate the flexible display panel of the organic light emitting diodes (OLEDs).

BRIEF SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

The present disclosure provides a display device that can roll up and extend down a rollable display panel using a drive motor.

The present technique miniaturizes a size of the drive motor by using an elastic unit in a display device with a rollable display panel.

In accordance with the present disclosure, there is provided a display device comprising: a rollable display panel configured to display an image; a display-panel roller, the display panel being fixed thereto, the roller being elongate; a support frame, the display-panel roller being rotatably coupled to the frame; a drive motor configured for rotating the display-panel roller with respect to the support frame, wherein a rotation of the display-panel roller allows roll-up of the panel around the roller or unroll-down of the panel from the roller; and an elastic unit configured to configured to provide an elastic force to assist in rolling up the display panel around the display-panel roller.

In one embodiment, the drive motor and elastic unit are disposed in the roller and respectively at positions adjacent to both opposite ends of the elongate display-panel roller.

In one embodiment, the device further comprises a weight bar coupled to the display panel at a bottom of the panel.

In one embodiment, the elastic unit is configured to store an elastic force during the unroll-down of the panel from the roller, and to release the stored elastic force to assist in rolling up the display panel around the display-panel roller.

In one embodiment, the elastic unit includes a torsion spring.

In one embodiment, the elastic unit includes: a hollow shaft connected to the fixed frame; and a torsion spring having one end thereof fixed to the hollow shaft and the other end thereof fixed to the display-panel roller.

In one embodiment, a tension of the torsion spring is adjustable by adjusting a fixed state of the hollow shaft.

In one embodiment, a circuit board is disposed in the display-panel roller and between the drive motor and elastic unit, wherein a wiring connected to the display panel is drawn through the elastic unit out of the roller.

In one embodiment, the elastic unit includes a compression spring.

In one embodiment, the elastic unit includes: a spring housing fixed to the support frame; a compression spring disposed inside the spring housing; a compression plate coupled to the spring to be axially slidable along and within the spring housing; a ball screw coupled to the compression plate; and a ball nut fixed to the display-panel roller, wherein the ball screw 262 is thread-coupled to the ball nut.

In one embodiment, the ball screw is hollow such that a wiring connected to the display panel passes through the ball screw.

In one embodiment, the device comprises a sensor configured to sense a rotation degree of the display-panel roller.

In accordance with the present disclosure, the display panel may be rolled up or extended down using the motor. Thus, the present display device may be more conveniently used.

Further, in accordance with the present disclosure, when the display-panel roller rotates so that the display panel descends, the elastic force is stored in the elastic unit. Then, the elastic force stored therein relieves the required power of the display-panel roller to roll up display panel. This allows the drive motor of the relatively small capacity or size to be employed.

DETAILED DESCRIPTIONS

Figure 1:
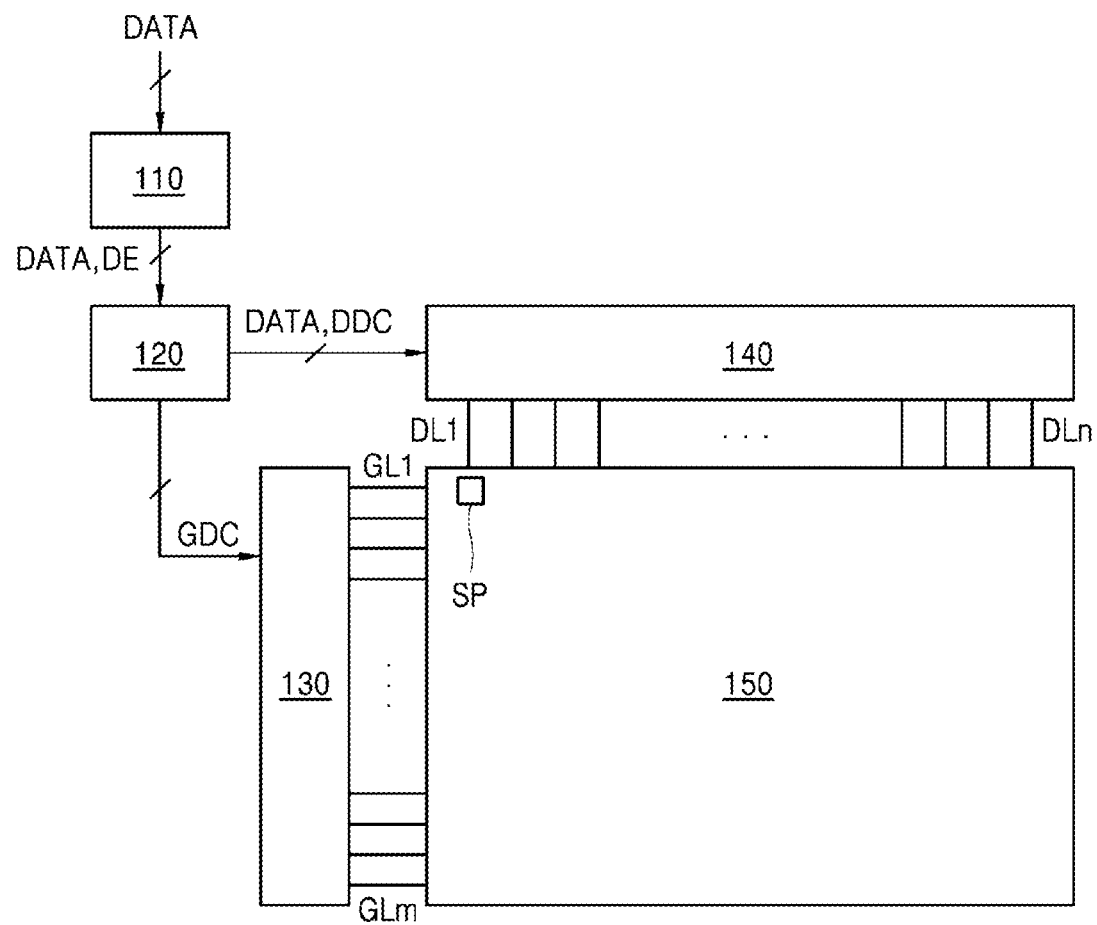
FIG. 1 is a schematic block diagram of an organic electroluminescent display device according to an embodiment of the present disclosure.

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, a display device with a rollable display panel according to the present disclosure will be described in detail with reference to the accompanying drawings.

Hereinafter, an organic electroluminescent display device will be described as an example of implementing a display device with a rollable display panel. However, the present disclosure is not limited thereto. Any display panel capable of implementing a display device with a rollable display panel may be applied to the present disclosure.

Figure 2:
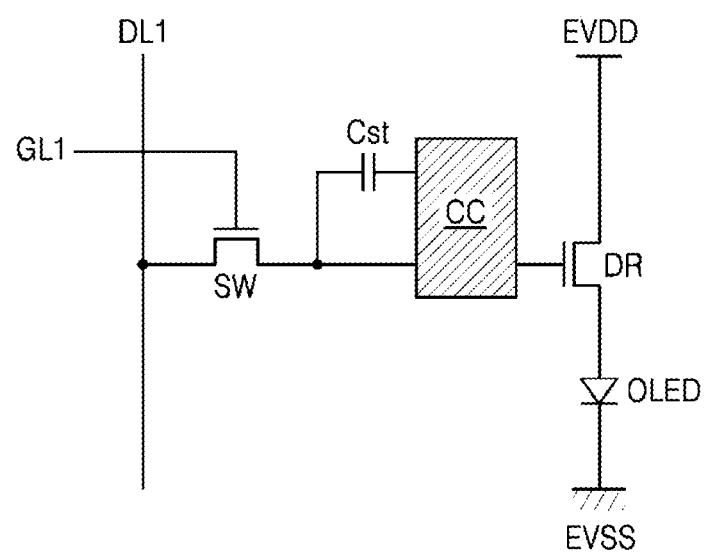
FIG. 2 shows a schematic circuit diagram of a sub-pixel.
Figure 3:
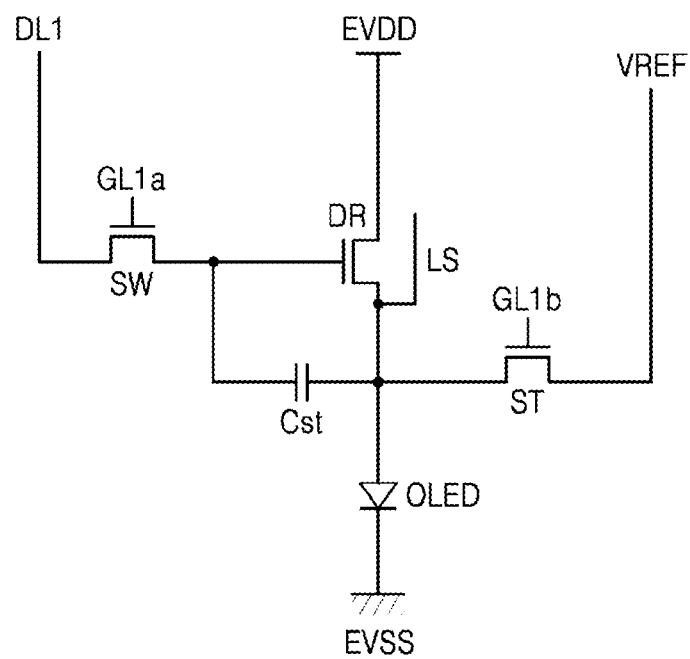
FIG. 3 shows an example of a sub-pixel configuration according to an embodiment of the present disclosure.

FIG. 1 is a schematic block diagram of an organic electroluminescent display device according to an embodiment of the present disclosure. FIG. 2 shows a schematic circuit diagram of a sub-pixel. FIG. 3 shows a structure of a sub-pixel according to an embodiment of the present disclosure.

As shown in FIG. 1, an organic electroluminescent display device according to an embodiment of the present disclosure includes an image processing unit 110, a timing control unit 120, a data driver 140, a scan driver 130, and a display panel 150.

The image processing unit 110 may be configured to output a data enable signal DE together with a data signal DATA supplied from the outside.

In addition to the data enable signal DE, the image processing unit 110 may be configured to output at least one of a vertical synchronization signal, a horizontal synchronization signal, and a clock signal. These signals have been omitted from the drawings for convenience of illustration.

The timing control unit 120 may be configured to receive the data signal DATA in addition to a drive signal including the data enable signal DE or the vertical synchronization signal, the horizontal synchronization signal, and the clock signal from the image processing unit 110. The timing control unit 120 may be configured to output a gate timing control signal GDC for controlling an operation timing of the scan driver 130 based on the drive signal and to output a data timing control signal DDC for controlling an operation timing of the data driver 140 based on the drive signal.

In response to receiving the data timing control signal DDC supplied from the timing control unit 120, the data driver 140 may be configured to sample and latch the data signal DATA supplied from the timing control unit 120, and, then, to convert the sample and latched data signal into a gamma reference voltage and to output the gamma reference voltage. The data driver 140 outputs the data signal DATA via data lines DL1 to DLn. The data driver 140 may be implemented as an IC (Integrated Circuit).

The scan driver 130 may be configured to output the scan signal while shifting the level of the gate voltage in response to the reception of the gate timing control signal GDC supplied from the timing control unit 120. The scan driver 130 outputs a scan signal through the scan lines GL1 to GLm. The scan driver 130 may be implemented as an IC integrated circuit, or may be formed in the display panel 150 in a GIP (gate in panel) manner.

The display panel 150 may be configured to display an image based on the data signal DATA and the scan signal supplied from the data driver 140 and the scan driver 130. The display panel 150 includes sub-pixels SP operable to display an image.

The sub-pixel may be implemented as a top-emission type, a bottom-emission type, or a dual-Emission type depending on a structure thereof.

The sub-pixels SP may include a red sub-pixel, a green sub-pixel, and a blue sub-pixel. Alternatively, the sub-pixels SP may include a white sub-pixel, a red sub-pixel, a green sub-pixel, and a blue sub-pixel. The sub-pixels SP may have at least one different light emission area, based on the light emission characteristics thereof.

As shown in FIG. 2, one sub-pixel includes a switching transistor SW, a driving transistor DR, a capacitor Cst, a compensation circuit CC, and an organic light emitting diode OLED.

The switching transistor SW is configured to perform a switching operation in response to the reception of the scan signal supplied through the first scan line GL1 so that the data signal supplied via the first data line DL1 is stored as a data voltage in the capacitor Cst. The drive transistor DR is configured to allow a drive current to flow into between a first power supply line EVDD and a second power supply line EVSS in accordance with the data voltage stored in the capacitor Cst. The organic light emitting diode OLED operates to emit light using the drive current from the drive transistor DR.

The compensation circuit CC may be a circuit added within the sub-pixel to compensate a threshold voltage of the drive transistor DR. The compensation circuit CC may include at least one transistor. A configuration of the compensation circuit CC varies greatly depending on a compensation method thereof. An example thereof is as follows.

As shown in FIG. 3, the compensation circuit CC includes a sensing transistor ST and a sensing line VREF. The sensing transistor ST is connected to a node (hereinafter referred to as a sensing node) between a source line of the drive transistor DR and an anode of the organic light emitting diode OLED. The sensing transistor ST is configured to supply an initialization voltage (or a sensing voltage) transmitted through the sensing line VREF to the sensing node or to sense a voltage or current of the sensing node.

The switching transistor SW includes a first electrode connected to the first data line DL1 and a second electrode connected to the gate electrode of the drive transistor DR. The drive transistor DR has a first electrode connected to the first power line EVDD and a second electrode connected to the anode of the organic light emitting diode OLED. The capacitor Cst has a first electrode connected to the gate electrode of the drive transistor DR and a second electrode connected to the anode of the organic light emitting diode OLED. The organic light emitting diode OLED has an anode connected to the second electrode of the drive transistor DR and a cathode connected to the second power line EVSS. The sensing transistor ST has a first electrode connected to the sensing line VREF and a second electrode connected to the anode of the organic light emitting diode OLED.

As used herein, the first electrode and the second electrode are defined as a source electrode and a drain electrode, or a drain electrode and a source electrode, respectively, based on the type of the transistor.

An operating time of the sensing transistor ST may be similar to or different from the operating time of the switching transistor SW, depending on the configuration or the compensation algorithm of the compensation circuit. In one example, the switching transistor SW has a gate electrode connected to a first sub-scan line GL1a, while the sensing transistor ST has a gate electrode connected to a second sub-scan line GL1b. In another example, the first sub-scan line GL1a coupled to the gate electrode of the switching transistor SW and the first sub-scan line GL1b coupled to the gate electrode of the sensing transistor ST may be shared by both transistors SW and ST.

The sensing line VREF may be connected to the data driver. In this case, the data driver may sense the sensing node of the sub-pixel during a non-display period of the image or an N frame (N is an integer of 1 or more) period, or in real time, and then, may allow the compensation circuit to perform the compensation based on the sensing result. In one example, the switching transistor SW and the sensing transistor ST may be turned on at the same time. In this case, the sensing operation through the sensing line VREF and the data output operation for outputting the data signal are distinguished from each other based on a time division by the data driver.

In addition, data to be compensated based on the sensing result may include a digital based data signal, an analog based data signal or a gamma voltage, and the like. Further, the compensation circuit for generating the compensation signal or the compensation voltage based on the sensing result may be implemented inside the data driver, inside the timing control unit, or as a separate circuit.

In FIG. 3, a sub-pixel having a 3T (transistors) 1C (capacitor) structure including the switching transistor SW, drive transistor DR, capacitor Cst, organic light emitting diode OLED, and sensing transistor ST is illustrated as an example. However, the present disclosure is not limited thereto. When the compensation circuit CC is added in the sub-pixel, the sub-pixel may include 3T2C, 4T2C, 5T1C, or 6T2C structure, or the like.

Because the organic electroluminescent display device as described above does not require a backlight unit, the organic electroluminescent display device may have a thinner display panel than that of a liquid crystal display. Further, since the display panel of the organic electroluminescent display device may be flexible as thin as possible, the display panel may be bent or curved. Further, the panel may be deformed in a rolled shape or the like.

Therefore, in recent years, various types of mechanical structures for housing display panels of the organic electroluminescent display devices have been designed. Hereinafter, a structure of a display panel that is rollable or extendable to implement a display device with a rollable display panel will be described.

Figure 4:
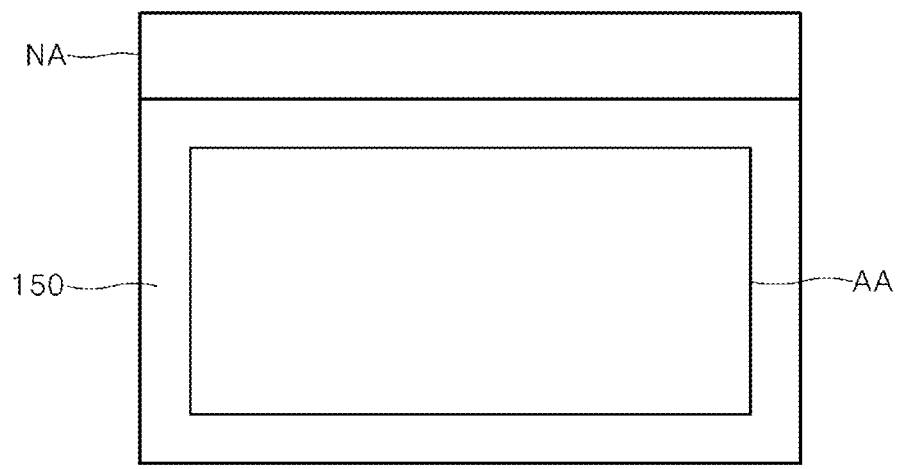
FIG. 4 is a plan view of a display panel according to an embodiment of the present disclosure.
Figure 5:
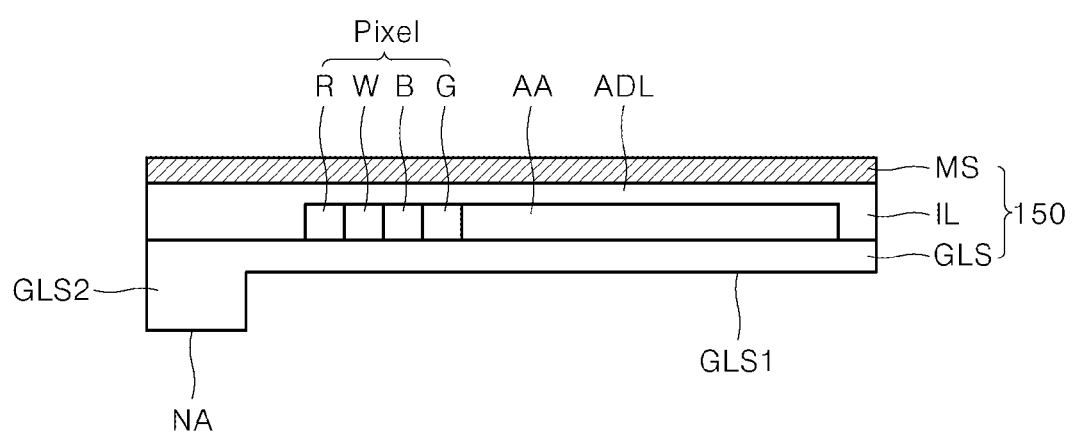
FIG. 5 is a cross-sectional view of a display panel according to an embodiment of the present disclosure.
Figure 6:
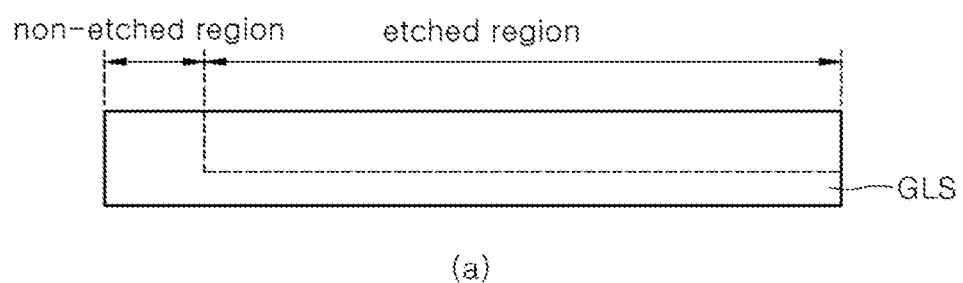
FIG. 6 is a sectional view showing an example of etching of a first substrate.
Figure 6:
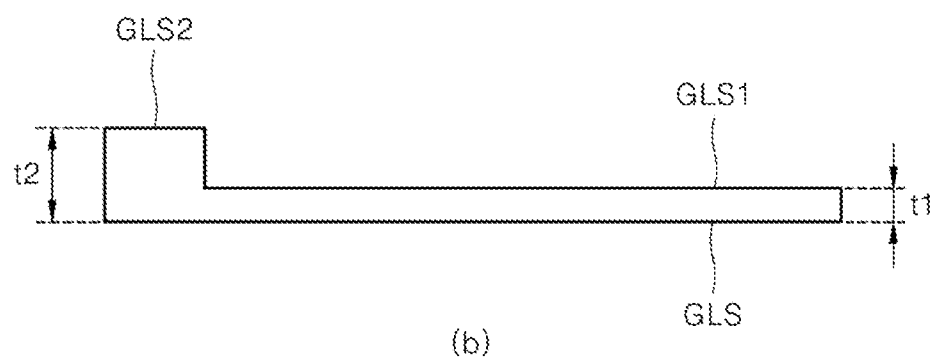
Figure 7:
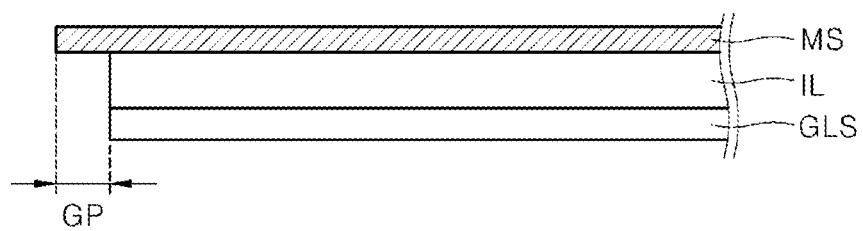
FIG. 7 is a sectional view showing an example of bonding between first substrate and second substrate.
Figure 8:
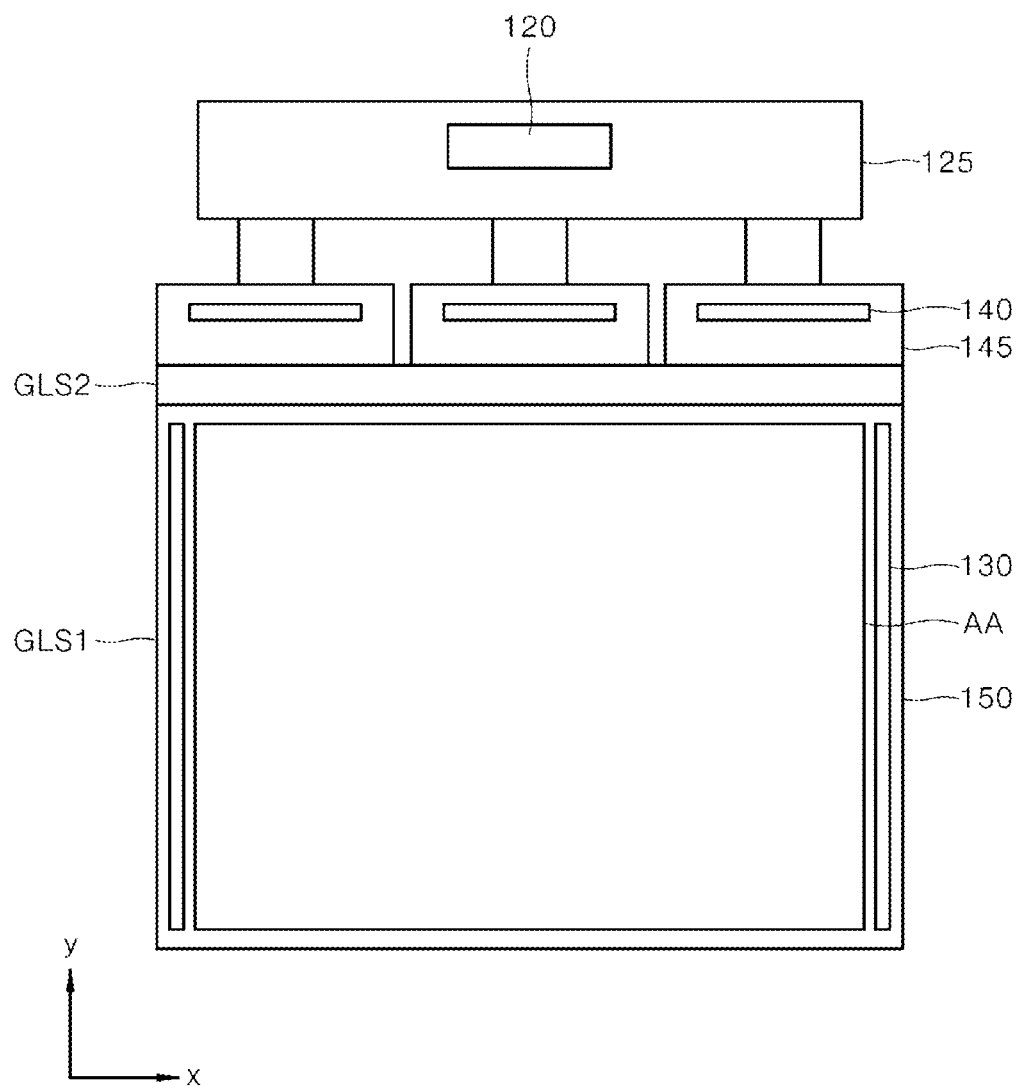
FIG. 8 is a plan view showing a modularized display panel.

FIG. 4 is a plan view of an exemplary display panel according to an embodiment of the present disclosure. FIG. 5 is a cross-sectional view of an exemplary display panel according to an embodiment of the present disclosure. FIG. 6 is a cross-sectional view showing an example etching of a first substrate. FIG. 7 is a cross-sectional view of a first substrate and second substrate as bonded together. FIG. 8 is a plan view of a modular display panel.

As shown in FIGS. 4 to 8, a display panel 150 according to an embodiment of the present disclosure includes a first substrate GLS, an intermediate layer IL having a display region AA including a plurality of pixels, and a second substrate MS.

The intermediate layer IL has an adhesive layer ADL in addition to the plurality of pixels constituting the display region AA. The plurality of pixels may include sub-pixels configured for emitting red R, white W, blue B and green G light beams. However, the present disclosure is not limited thereto. The adhesive layer ADL may be made of an adhesive material which enables bonding between first substrate GLS and second substrate MS, and seals the intermediate layer IL located between the first substrate GLS and the second substrate MS.

The first substrate GLS may be made of glass or resin. A thickness of the first substrate GLS may be 0.01 mm to 0.2 mm.

From experimental results, it may be confirmed that when the thickness of the first substrate GLS is as thin as 0.01 mm to 0.1 mm, and even when the first substrate is made of glass instead of resin, the first substrate may be rolled into a rolled state or may be unrolled in an extended state.

The first substrate GLS has an etched region (etched portion) GLS1 and a non-etched region (non-etched portion) GLS2. On the non-etched region GLS2, a pad for connection with an external substrate may be disposed. The non-etched region GLS2 has an elongated rectangular shape.

In the non-etched region GLS2, the first substrate may be connected to an external substrate. The non-etched portion enhances the rigidity of the substrate. To this end, it is desirable that the non-etched region GLS2 occupies 5% to 10% of a total area of the first substrate GLS. Further, the non-etched region GLS2 has a higher rigidity than that of the etched region GLS1. To this end, the thickness t2 of the non-etched region GLS2 is preferably selected to be in a range of from 0.1 mm to 0.2 mm.

Except for the non-etched region GLS2, the first substrate is partially removed by an etching process to form the etched region GLS1. The etched region GLS1 is provided to mitigate a tensile stress that the first substrate GLS may receive when the display panel 150 is rolled in a rolled state or is unrolled in an extended state. For this purpose, a thickness t1 of the substrate in the etched region GLS1 is preferably selected from the range of 0.01 mm to 0.1 mm.

The second substrate MS may be made of metal. A thickness of the second substrate MS may be selected from a range of 0.01 mm to 0.2 mm. The second substrate MS absorbs, disperses and alleviates the tensile stress that the first substrate GLS may receive when the display panel 150 is coiled in a rolled state or is unrolled in an extended state.

From experimental results, it may be confirmed that when the thickness of the second substrate MS is as thin as 0.01 mm to 0.2 mm, the second substrate effectively absorbs, disperses and alleviates the tensile stress that the first substrate GLS may receive when the display panel 150 is coiled in a rolled state or is unrolled in an extended state.

Since the second substrate MS is made of a metal material, the second substrate is more resistant to impact than the first substrate GLS. As a result, the second substrate MS may be made larger than the first substrate GLS. That is, the second substrate MS may have a protruding region GP in which the second substrate protrudes outward, as compared to the first substrate GLS. The protruding region may exist at one or more positions. Further, the protrusion region GP of the second substrate MS may effectively serve to protect a corner of the first substrate from an impact that the first substrate GLS may otherwise receive.

Meanwhile, the display panel 150 may be electrically connected to the timing control unit 120, data driver 140, scan driver 130, and the like (the image processing unit or power supply unit is not shown). As a result, the display panel is modularized as shown in FIG. 8.

The scan driver 130 is formed in the display panel 150 in a gate-in-panel fashion. The data driver 140 is implemented in the source substrate 145. The timing control unit 120 and the like are mounted in the control substrate 125.

In order to coil the display panel 150 in a rolled state, it may be preferable to form the scan driver 130 to the left side and/or the right side of the display region AA in a GIP (Gate In Panel) manner. However, the present disclosure is not limited thereto. Further, the data driver 140 may be mounted in the source substrate 145 serving as a flexible circuit board, while the timing control unit 120 and the like may be mounted in the control substrate 125 serving as the printed circuit board. However, the present disclosure is not limited thereto. Further, the source substrate 145 and the control substrate 125 may be connected with each other via a cable 123. However, the present disclosure is not limited thereto.

Hereinafter, a mechanical structure for implementing a display device with a rollable display panel will be described.

Figure 9:
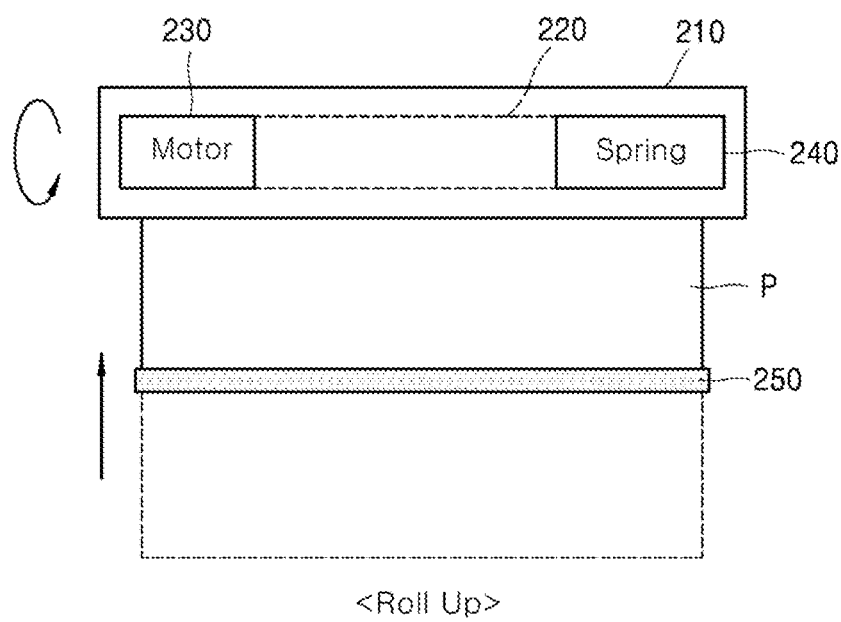
FIGS. 9 and 10 show a display device with a rollable display panel according to an embodiment of the present disclosure.
Figure 10:
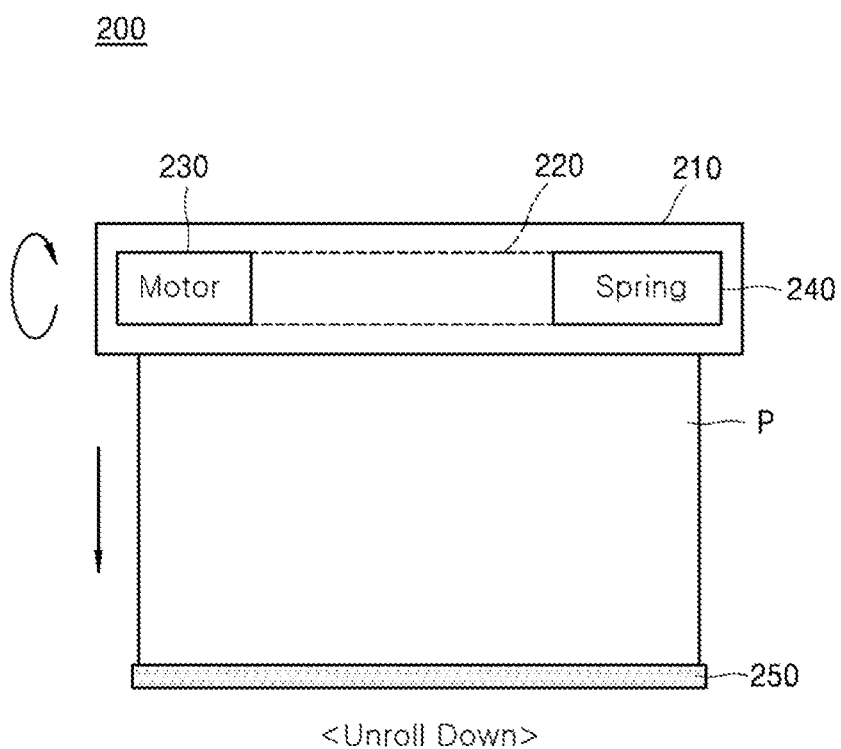

FIG. 9 and FIG. 10 show a display device with a rollable display panel according to an embodiment of the present disclosure.

As shown, the display device with a rollable display panel according to an embodiment of the present disclosure includes a display panel P for displaying an image, and a rolling and unrolling mechanism for rolling up the display panel P or unrolling it down.

The rolling and unrolling mechanism includes a display-panel roller 220 to which the display panel P is fixed by a first end of the display panel P, e.g., an upper end of the display panel P, a support frame 210 to which the display-panel roller 220 is rotatably coupled, a drive motor 230 for providing a driving force for rotating the display-panel roller 220 relative to the support frame, and an elastic unit 240, e.g., a spring, configured to provide an elastic force to assist in rolling up the display-panel roller 220.

A weight bar 250 is coupled to a second end of the display panel P, e.g., the lower end of the display panel P. The weight bar 250 keeps the entire face of the display panel flat. The weight bar serves to pull down the panel P so that the display panel P may smoothly descend.

The weight bar 250 may be made of a metal material, a synthetic resin material, a natural material, or a combination thereof.

For example, the weight bar 250 may be formed of a stack of a metal material layer and a synthetic resin material layer.

Alternatively, the weight bar 250 may be a stack of a metal layer and a natural wood layer or a stone layer.

The weight bar 250 may be attached to the display panel P with an adhesive. Alternatively, the weight bar may be fixed to the display panel P using fastening means.

The drive motor 230 rotates the display-panel roller 220 in two directions, e.g., clockwise and counter-clockwise directions. As illustratively shown in FIG. 10, in an example, when the drive motor 230 rotates the display-panel roller 220 clockwise, the display panel P unrolls down. As illustratively shown in FIG. 9, in an example, when the drive motor rotates the display-panel roller 220 counterclockwise, the display panel P is rolled up.

As shown in FIG. 10, when the display panel P is uncoiled down, the required power of the drive motor 230 for the uncoiling down operation may be reduced due to the weight of the display panel P and the weight bar 250

However, as shown in FIG. 9, when the display panel P is coiled up, the more power of the drive motor 230 may be required due to the weight of the display panel P and the weight bar 250.

Thus, a specification of the drive motor 230 may be adapted to the force required to roll up the display panel P.

However, for the large-sized display panel P, the weight of the display panel P and the weight of the weight bar 250 increase the size and power consumption of the drive motor 230, which generates the required driving force to roll up the display panel P.

Thus, according to the present disclosure, the driving motor 230 may be downsized, e.g., in the size and power consumption, by using the elastic force stored in the elastic unit 240 together with the driving force of the drive motor 230 to roll up the display panel P.

As shown in FIG. 10, when the display panel P is lowered down, the elastic force is stored in the elastic unit 240 due to the weight of the weight bar 250. As shown in FIG. 9, when the display panel P is lifted up, the elastic force stored in the elastic unit 240 acts in the direction of rolling up the display panel to assist the roll-up by the display-panel roller 220.

In other words, when the display-panel roller 220 rotates in the direction of lowering the display panel P, the elastic unit 240 stores therein the elastic force generated by the load of the load bar. Then, the elastic unit 240 releases the stored elastic force to help the display-panel roller 220 lift up the display panel P.

Further, in accordance with the present disclosure, the drive motor 230 and the elastic unit 240 are disposed within the display-panel roller 220 and at positions adjacent to both ends thereof, respectively.

With the above structure, the size of the entire display device with a rollable display panel may be reduced, and, further, the appearance thereof may be improved.

Further, when the motor rolls up the display panel P, rotational forces from the motor and elastic unit may be transmitted to both ends of the display-panel roller 220 respectively. This allows the display panel P to be evenly wound around the display-panel roller 220.

Figure 11:
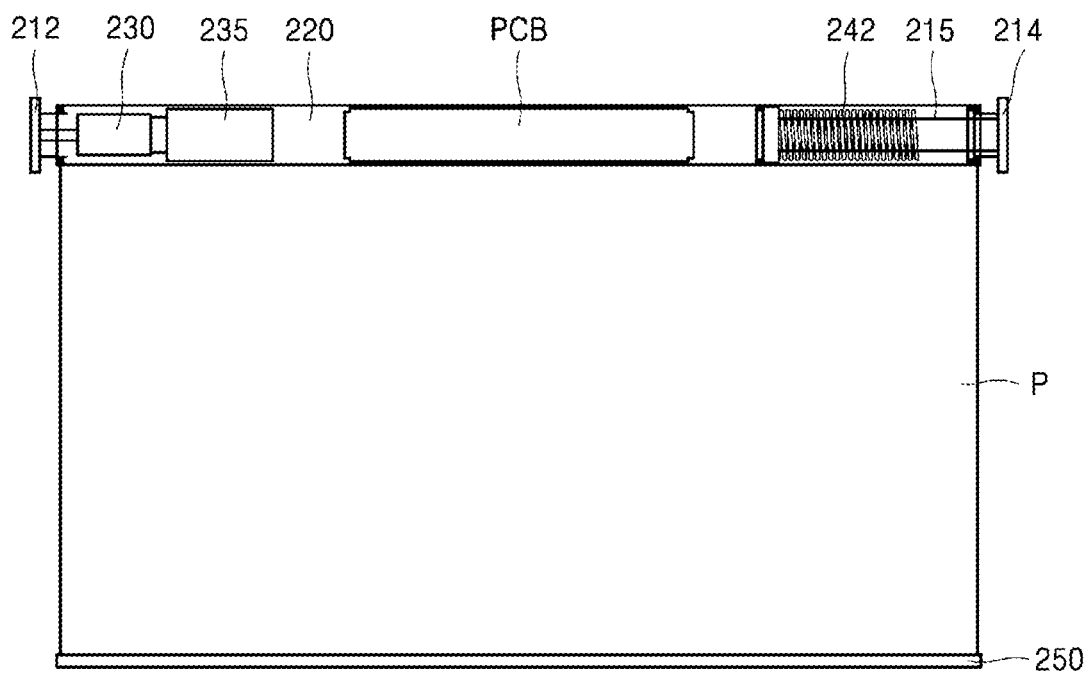
FIG. 11 shows a structure of an elastic unit according to a first embodiment of the present disclosure.

FIG. 11 shows the structure of the elastic unit 240 (FIG. 10) according to a first embodiment of the present disclosure.

The elastic unit 240 (FIG. 10) according to the first embodiment of the present disclosure includes a torsion spring 242.

The torsion spring 242 serves to convert the torsional torque to an elastic force. Thus, according to the present disclosure, using a relatively simple structure of the torsion spring, the elastic force may be stored in the unrolling down of the display panel. Further, the degree of torsion of the torsion spring 242 may be controlled to adjust the magnitude of the stored elastic force.

One end of the torsion spring 242 is fixed to the support frame 210, while the other end of the torsion spring is fixed to the display-panel roller 220.

When the display-panel roller 220 rotates in the unrolling down operation, a torsion torque is applied to the torsion spring 242, and the torque is converted into the elastic force. Then, the elastic force is stored in the torsion spring 242.

That is, when the display-panel roller 220 rotates so that the display panel P descends, the elastic force is stored in the torsion spring 242. Then, the elastic force stored in the torsion spring 242 relieves the required power of the display-panel roller 220 to roll up display panel P.

Therefore, together with the driving force of the drive motor 230, the elastic force stored in the torsion spring 242 acts to roll up the display panel P. This allows the drive motor 230 of the relatively small capacity or size to be employed.

Further, the present device preferably further includes a sensor 235 for sensing the amount of rotation of the drive motor 230. The sensor 235 senses the rotational angle of the display-panel roller 220 or the drive motor 230.

Based on the amount of rotation sensed by the sensor 235, the control unit can control the operation and stop of the drive motor 230.

The support frame includes both end plates 212 and 214 that are coupled to both ends of the display-panel roller 220 respectively.

In the illustrated embodiment, the drive motor 230 is disposed to the left side of the display-panel roller 220 while the elastic unit 240 is disposed to the right side of the display-panel roller 220. The left plate 212 is connected to the drive motor 230 while the right plate 214 is connected to the elastic unit 240.

In this connection, a hollow shaft 215 may be coupled to the right plate 214. The hollow shaft 215 is inserted into the display-panel roller 220. The torsion spring 242 coils the outer side of the hollow shaft 215. The torsion spring 242 is disposed within the display-panel roller 220. One end of the torsion spring 242 is fixed to the hollow shaft 215 while the other end of the torsion spring 242 is fixed to the display-panel roller 220.

The hollow shaft 215 is rotatable with respect to the right plate 214 and is rotatably coupled to a specific position of the right plate 214. When the hollow shaft 215 rotates in place, a torsion torque may be applied to the torsion spring 242. Thus, rotating the hollow shaft 215 relative to the right plate 214 adjusts the elastic force stored in the torsion spring 242.

Further, between the drive motor 230 and the elastic unit 240, the printed circuit board PCB of the display panel P may be arranged. The printed circuit board PCB may be embodied as the control substrate 125 as described above.

A wiring connected to the printed circuit board PCB of the display panel P may be drawn out of the display-panel roller 220 through the hollow shaft 215.

The wiring for transmitting a signal to the display panel P or supplying power to the display panel P must be connected to the display panel. Such wiring may be drawn out to the outside through the inside of the display-panel roller, thereby ensuring the durability of the wiring and improving the reliability of the product.

In this case, the wiring remains untwisted when the display panel P rolls up or unrolls down to the midpoint of the maximum extension. It is desirable to reduce the twist of the wiring when the display panel is fully wound or completely unwound.

For example, when the display-panel roller 220 makes three rotations that is, three times of 360 degree, the display panel P is completely lowered down. When the display panel rotates three times in the opposite direction, the display panel P is completely wound up. In this case, it is desirable to configure the wiring as follows: the wiring is in a neutral state (in a non-twisted) when the roller has rotated 1.5 times in a clockwise or counter-clockwise direction; when the display-panel roller 220 is completely wound up, the wiring is twisted by 1.5 turns; conversely, when the display-panel roller 220 is completely unrolled down, the wiring is twisted by 1.5 turns in a opposite direction.

Figure 12:
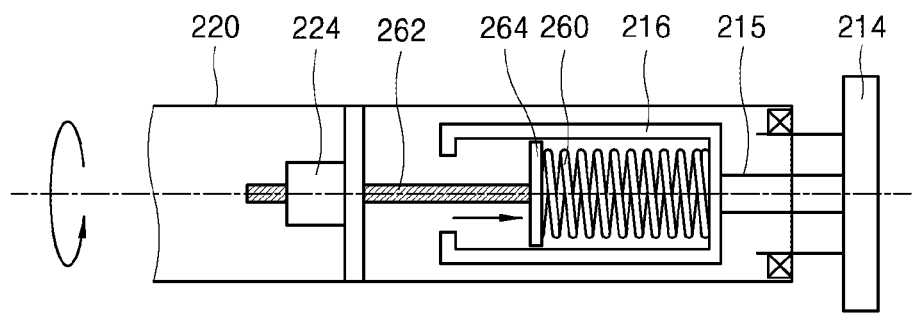
FIGS. 12 and 13 show a structure of an elastic unit according to a second embodiment of the present disclosure.
Figure 13:
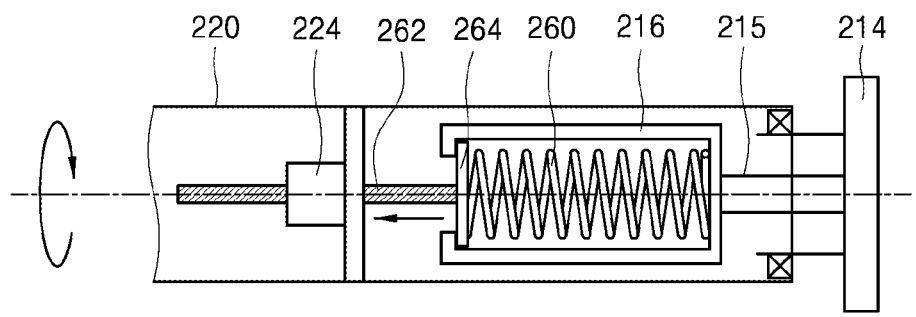

FIGS. 12 and 13 show a structure of an elastic unit 240 (FIG. 10) according to the second embodiment of the present disclosure.

The elastic unit 240 according to the second embodiment of the present disclosure is configured to store the elastic force using a compression spring.

As shown, the elastic unit 240 according to the second embodiment of the present disclosure includes a spring housing 216 fixed to the right plate 214 of the support frame, a compression spring 260 disposed inside the spring housing 216, a compression plate 264 coupled to the spring to be axially slidable within the spring housing 216, a ball screw 262 coupled to the compression plate 264, and a ball nut 224 fixed to the display-panel roller 220 and thread-coupled to the ball screw 262.

As shown in FIG. 12, when the display-panel roller 220 rotates to lower the display panel P, the ball nut 224 is rotated together with the roller with respect to the ball screw 262. Thus, the ball screw move to the right, and, hence, the compression plate 264 moves to the right, thereby compressing the compression spring 260.

Conversely, as shown in FIG. 13, when the display-panel roller 220 is rotated so as to roll up the display panel P, the ball nut 224 rotates in an opposite direction to the previous direction with respect to the ball screw 262, so that the compression plate 264 moves to the left. At this time, the elastic restoring force previously stored in the compression spring 260 assists the roll-up operation by the display-panel roller 220.

Although the ball screw 262 is shown to have a small diameter in the drawing, the ball screw 262 may have a large outer diameter and a hollow portion may be formed inside the ball screw 262.

When the ball screw 262 is formed in the hollow shape, the wiring connected to the printed circuit board PCB of the display panel may be drawn out through the hollow ball screw 262 as described in the first embodiment.

The configuration using the compression spring 260 is more complicated than the configuration using the torsion spring. However, for the configuration using the compression spring, there is a smaller change in the outer diameter of the spring in compression and elongation of the spring compared to the configuration using the torsion spring.

In the above description, numerous specific details are set forth in order to provide a thorough understanding of the present disclosure. The present disclosure may be practiced without some or all of these specific details. Examples of various embodiments have been illustrated and described above. It will be understood that the description herein is not intended to limit the claims to the specific embodiments described. On the contrary, it is intended to cover alternatives, modifications, and equivalents as may be included within the spirit and scope of the present disclosure as defined by the appended claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a rollable display panel configured to display an image; and
   a support frame coupled to the rollable display panel, the support frame including:
   a display-panel roller coupled to the rollable display panel at a first end of the display panel, a rotation of the display-panel roller allowing at least one of winding of the display panel around the display-panel roller or unwinding of the display panel from the display-panel roller;
   a drive motor configured for rotating the display-panel roller with respect to the support frame; and
   an elastic unit configured to provide an elastic force to assist in winding of the display panel around the display-panel roller,
   wherein the drive motor and the elastic unit are disposed in the display-panel roller and respectively at positions adjacent to opposite ends of the display-panel roller.

2. The device of claim 1, further comprising a weight bar coupled to the display panel at a second end of the display panel, wherein the second end is opposite of the first end of the display panel.

3. The device of claim 1, wherein the elastic unit is configured to store an elastic force during the unwinding of the panel from the roller, and to release the stored elastic force to assist in the winding the display panel around the display-panel roller.

4. The device of claim 3, wherein the elastic unit includes a torsion spring.

5. The device of claim 1, wherein the elastic unit includes:
   a hollow shaft connected to the support frame; and
   a torsion spring coiling an outer side of the hollow shaft, and having one end thereof fixed directly to the hollow shaft and the other end thereof fixed to the display-panel roller.

6. The device of claim 5, wherein a tension of the torsion spring is adjustable by adjusting a fixed state of the hollow shaft.

7. The device of claim 1, wherein a circuit board is disposed in the display-panel roller and between the drive motor and elastic unit, wherein a wiring from the circuit board connected to the display panel is drawn through the elastic unit out of the roller.

8. The device of claim 3, wherein the elastic unit includes a compression spring.

9. The device of claim 1, wherein the elastic unit includes:
a spring housing fixed to the support frame;
a compression spring disposed inside the spring housing;
a compression plate coupled to the compression spring and configured to axially move along and within the spring housing;
a ball screw coupled to the compression plate; and
a ball nut fixed to the display-panel roller, the ball screw being thread-coupled to the ball nut.

10. The device of claim 9, wherein the ball screw is hollow such that a wiring connected to the display panel passes through the ball screw.

11. The device of claim 1, further comprising a sensor configured to sense a rotation degree of the display-panel roller.

12. The device of claim 1, wherein the display-panel roller is elongate.

13. The device of claim 7, wherein the wiring connected to the circuit board transmits a signal to the display panel or supplies power to the display panel, wherein the wiring of the circuit board is drawn out to the outside through the inside of the display-panel roller.

14. The device of claim 7, wherein the wiring is in a non-twisted state when the display panel winds up or unwinds down to the midpoint of the maximum extension.

15. A display device, comprising:
a rollable display panel configured to display an image; and
a support housing coupled to the rollable display panel, the support housing having a first end plate and a second end plate, the support housing further including:
a display-panel roller coupled to the rollable display panel, a rotation of the display-panel roller allowing at least one of winding of the rollable display panel around the display-panel roller in a first direction or unwinding of the rollable display panel from the display-panel roller in a second direction opposite of the first direction, wherein the display-panel roller has a first end and a second end that is respectively coupled to the first end plate and the second end plate of the support housing, the display-panel roller including;
a drive motor configured for rotating the display-panel roller to wind or unwind the rollable display panel; and
a compression unit configured to utilize elastic energy stored in the compression unit for winding the rollable display panel around the display-panel roller.

16. The display device of claim 15, wherein the compression unit includes:
a compression spring having a first end and a second end; and
a compression plate directly coupled to the first end of the compression spring.

17. The display device of claim 16, wherein the compression unit further includes:
a spring housing, wherein the compression spring and the compression plate is within the spring housing,
wherein the second end of the compression spring is coupled to the spring housing,
wherein the compression plate slidably moves along a length direction of the display-panel roller within the spring housing.

18. The display device of claim 17, wherein a movement of the compression plate along the length direction is orthogonal to at least one of the first direction or the second direction.

19. The display device of claim 17, wherein the winding of the rollable display panel around the display-panel roller in the first direction slidably moves the compression plate farther from the second end plate of the support housing,
wherein the unwinding of the rollable display panel from the display-panel roller in the second direction slidably moves the compression plate closer to the second end plate of the support housing.

* * * * *

UNITED STATES PATENT AND TRADEMARK OFFICE
CERTIFICATE OF CORRECTION

PATENT NO.       : 10,701,821 B2
APPLICATION NO.  : 16/046766
DATED            : June 30, 2020
INVENTOR(S)      : Jeonghun Kim et al.

It is certified that error appears in the above-identified patent and that said Letters Patent is hereby corrected as shown below:

On the Title Page

In the References Cited, Foreign Patent Documents, second column:
"CN 10625179 A 12/2016" should be: -- CN 106251779 A 12/2016 --.

Signed and Sealed this
Twentieth Day of October, 2020

Andrei Iancu
*Director of the United States Patent and Trademark Office*